(12) United States Patent
Kwak

(10) Patent No.: US 7,375,565 B2
(45) Date of Patent: May 20, 2008

(54) DELAY LOCKED LOOP IN SEMICONDUCTOR MEMORY DEVICE

(75) Inventor: Jong-Tae Kwak, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 194 days.

(21) Appl. No.: 10/877,071

(22) Filed: Jun. 25, 2004

(65) Prior Publication Data

US 2005/0195663 A1 Sep. 8, 2005

(30) Foreign Application Priority Data

Mar. 5, 2004 (KR) .................. 10-2004-0014909

(51) Int. Cl.
*H03L 7/06* (2006.01)

(52) U.S. Cl. .................. 327/158; 327/49; 327/161

(58) Field of Classification Search .............. None
See application file for complete search history.

(56) References Cited

U.S. PATENT DOCUMENTS 5,977,801 A 11/1999 Boerstler

| 6,137,328 A | 10/2000 | Sung |
| 6,366,148 B1 | 4/2002 | Kim |
| 6,518,807 B1 * | 2/2003 | Cho ................... 327/158 |
| 2002/0084857 A1 | 7/2002 | Kim |
| 2003/0174003 A1 | 9/2003 | Nogami |

* cited by examiner

*Primary Examiner*—Quan Tra
*Assistant Examiner*—Khareem E. Almo
(74) *Attorney, Agent, or Firm*—Blakely, Sokoloff, Taylor & Zafman

(57) ABSTRACT

A delayed lock loop for preventing a stuck fail in a deadzone includes a clock buffering block for generating a first and a second internal clock signals; a phase comparison block for delaying a feedback signal by a first predetermined value and for respectively comparing a phase of a delayed feedback signal and a phase of the feedback signal with a phase of the external clock signal; a clock selecting block for selecting one of the first and second internal clock signals based on one comparison result to thereby generate a selected internal clock signal; a stuck checking block for determining a delay value based on the other comparison result; a delay line block for delaying the selected internal clock signal by the delay value; and an output buffer for buffering an outputted signal from the delay line block to thereby generating a DLL clock signal.

10 Claims, 15 Drawing Sheets

DELAY LOCKED LOOP IN SEMICONDUCTOR MEMORY DEVICE

FIELD OF INVENTION

The present invention relates to a semiconductor memory device; and, more particularly, to a delay locked loop, included in the semiconductor memory device, for preventing a stuck fail in a dead-zone.

DESCRIPTION OF PRIOR ART

Generally, a clock signal of a system or a circuit is used as a reference for synchronizing an execution timing and guaranteeing an error-free high speed operation. When an external clock signal of an external circuit is used in an internal circuit, a clock skew is generated from an internal circuit because of timing gap between the external clock signal and the internal clock signal. A delay locked loop (hereinafter, referred as DLL) compensates the clock signal skew for equalizing a phase of the internal clock signal to that of the external clock signal.

Moreover, the DLL is an apparatus for compensating the clock skew not only between the external clocks signal and the internal clock signal but also between the external clock signal and data; and, thus, may be applied to not only a semiconductor device but also a computer system.

In addition, the DDL are broadly used in a synchronous semiconductor memory device including a double data rate synchronous dynamic random access memory (DDR SDRAM) because it has an advantage with being less affected by a noise, as compared to a phase locked loop (hereinafter, referred as PLL). Among various types of the DLL, a register controlled DLL is the most generally used.

For example, the register controlled DLL in the synchronous semiconductor memory device (SDRAM) synchronizes a data output with the external clock signal by fore-reflecting a negative delay after receiving the external clock signal and compensating a delay value of data and clock signal paths.

FIG. 1 is a block diagram showing a delayed locked loop (DLL) of the DDR SDRAM in accordance with an embodiment of the prior art.

The DLL includes first and second clock buffers 111 and 112, a clock divider 113, first to third delay line blocks 114 to 116, a shift register 117, a shift controller 118, a phase comparator 119, first and second DLL drivers 120 and 121 and a delay model 122.

The first clock buffer 111 receives a reverse external clock signal /clk and synchronizes the reverse external clock signal /clk with a falling edge of an external clock signal clk to thereby generate a first internal clock signal fall_clk. The second clock buffer 112 receives the external clock signal clk and synchronizes the external clock signal clk with a rising edge of the external clock signal clk to thereby generate a second internal clock signal rise_clk.

The clock divider 113 outputs a delay monitoring clock signal dly_in and a reference clock signal ref, after dividing the second internal clock signal rise_clk by 1/N where N is a positive constant. In this case, N is 8. The first to third delay line block 114, 115 and 116 respectively receive the first internal clock signal fall_clk, the second internal clock signal rise_clk and the delay monitoring clock signal dly_in and delay each signal, i.e., fall_clk, rise_clk and dly_in, by each predetermined delay value controlled by the shift register 117 to thereby generate first and second DLL clock signals ifclk and irclk and a feedback signal feedb respectively.

The feedback signal feedb outputted from the third delay line block 116 is inputted to the delay model 122. The delay model 122 reflects delay values of actual clock signal and data paths to the feedback signal feedb and outputs a delayed feedback signal dfeedb to the phase comparator 20. Namely, the delay model 122 is a kind of replica circuit. The phase comparator 119 compares a phase of the delayed feedback signal dfeedb outputted from the delay model 122 with a phase of the reference clock signal ref.

The shift controller 118 determines a shift direction of the shift register 117 in response to a shift control signal ctrl outputted from the phase comparator 119. After determining the shift direction, the shift controller 118 outputs first and second shift control signals SR and SL. At this time, if the SR is enabled, a shift value of the shift register 117 moves to the right and, on the other hand, if the SL is enabled, the shift value of the shift register 117 moves to the left. According to the shift value of the shift register 117, each delay value of the first to third delay line blocks 114 to 116 is adjusted.

The first and second DLL clock signals ifclk and irclk outputted from the first and second delay line blocks 114 and 115 are inputted to the first and second DLL drivers 120 and 121. The first and second DLL drivers 120 and 121, which are a kind of buffer, generate the first and second driving clock signals fclk_dll and rclk_dll.

FIGS. 2A and 2B are waveforms demonstrating an operation of the DLL shown in FIG. 1. As shown, there are described delay values D and D' which are compensated by the DLL, i.e., phase differences between the reference clock signal ref and the delayed feedback signal dfeedb.

Referring to FIG. 2A, an initial phase of the delayed feedback signal dfeedb leads against a phase of the reference clock signal ref by the delay value D. In this case, the DLL delays the delayed feedback signal dfeedb by the delay value D; and, then, the phase of the delayed feedback signal dfeedb is synchronized with a rising edge of the reference clock signal ref.

In addition, referring to FIG. 2B, in a initial operation state that the phase of the delayed feedback signal dfeedb legs against a phase of the reference clock signal ref by a predetermined value, i.e., tCK−D' (herein, tCK is one period of the reference clock signal; and D' is the delay value), the DLL also delays the delayed feedback signal dfeedb by the delay value D' so that the phase of the delayed feedback signal dfeedb is synchronized with a rising edge of the reference clock signal ref. It is better that the delayed feedback signal dfeedb is advanced by the predetermined value if it is possible. However, in the initial operation state, it is impossible to reduce the predetermined value because the delayed feedback signal dfeedb passes through a minimum number of delay units.

For delaying the delayed feedback signal dfeedb by the delay value D' shown in FIG. 2B, the first to third delay line blocks 114 to 116 includes a lot of delay units which are enough to delay an inputted signal, e.g., rise_clk, by one period of the reference clock signal tCK. Namely, each delay line block has a plurality of delay units for delaying the inputted signal by a maximum delay value, i.e., one period of the external clock signal clk. Herein, the maximum delay value is determined based on an operation frequency, a temperature and the like.

In the other words, each delay line block, e.g., 114, is a functional block having a largest size in other blocks, e.g., 111, included in the DLL. Thus, for delaying the inputted signal by a desired delay value, each delay line block has too large size and consumes a large power. Also, because, in the worse case, the DLL should delay the inputted signal by a most of one period of the reference clock signal, too much time for locking, i.e., synchronizing the inputted signal with the reference clock signal is needed.

Until now, for overcoming above described disadvantages, another conventional DLL is suggested.

FIG. 3 is a block diagram showing a DLL in accordance with another embodiment of the prior art.

As shown, the DLL includes first and second input buffers 311 and 312, a multiplexer 315, a MUX controller 314, a phase comparison block 313, a delay line block 317, a delay line control block 316, a delay modeling block 318 and an output buffer 319.

Herein, the first and second input buffers 311 and 312 are corresponded to the first and second clock buffers 111 and 112 shown in FIG. 1. Also, the output buffer 319 is similar to one of the first and second DLL drivers 120 and 121. The delay modeling block 318 and the phase comparison block 313 are respectively matched with the phase comparator 119 and the delay model 122.

Referring to FIG. 3, the phase comparison block 313 compares an external clock clk inputted from an external part and a feedback signal fb outputted from the delay modeling block 318. Then, based on the comparison result of the phase comparison block 313, the MUX controller 314 and the multiplexer 315 determines which one of first and second internal clock signals is outputted to the delay line block 317; and the delay line control block 316 determines a delay value of the delay line block 317. Finally, the delay line block 317 delays an inputted signal by the delay value in order to synchronize the inputted signal with one of the external clock signal clk and a reverse external clock signal clkb. Thus, it is enough that the delay line block 317 has relatively fewer delay units than each of the first to third delay line blocks shown in FIG. 1 does, because the maximum delay value of the delay line block 317 is a half period of the external clock signal clk.

FIGS. 4A and 4B are waveforms demonstrating an operation of the DLL shown in FIG. 3.

In a first case shown in FIG. 4A, a phase difference between the external clock signal clk and the feedback signal fb is smaller than a half period of the external clock signal clk. At this time, as the comparison result of the phase comparison block 313, the multiplexer 315 outputs the reverse external clock /clk to the delay line block 317. Thus, though the feedback signal should be delayed by over half period of the external clock signal, i.e., (tCK−tD), the delay line block 317 actually delay a reverse feedback signal /fb by a predetermined value, i.e., (tCK/2−tD) in order to synchronize the reverse feedback signal /fb with a rising edge of the external clock signal clk. Herein, tCK is one period of the external clock signal; and tD is a phase difference between the external clock signal clk and the feedback signal fb. Namely, for reducing the delay value of the delay line block 317, the multiplexer 315 outputs the reverse external clock signal /clk to the delay line block 317; and the delay line control block 316 outputs the reverse feedback signal /fb to the delay line block 317.

Referring to FIG. 4B, in a second case, the phase difference between the external clock signal clk and the feedback signal fb is larger than a half period of the external clock signal clk. At this time, as the comparison result of the phase comparison block 313, the multiplexer 315 outputs the external clock clk to the delay line block 317. Thus, the delay line block 317 actually delay a reverse feedback signal /fb by a predetermined value, i.e., (tCK−tD) in order to synchronize the feedback signal fb with the rising edge of the external clock signal clk. Namely, for reducing the delay value of the delay line block 317, the multiplexer 315 outputs the external clock signal clk to the delay line block 317; and the delay line control block 316 outputs the feedback signal fb to the delay line block 317.

However, above described DLL does not guarantee a stable operation when a phase difference between the external clock signal clk and the feedback signal fb is in a dead-zone. Herein, the dead-zone is a duration that it is very difficult to find the phase difference between the external clock signal clk and the feedback signal fb because those two signals clk and fb respectively have really closed phase.

FIG. 5 is waveforms describing an operation error of the DLL shown in FIG. 3.

As shown, it is assumed that a phase of the feedback signal fb generated by feed-backing the external clock signal clk is similar to that of the reverse external clock signal, i.e., the feedback signal fb has a half period (tCK/2) delay value. At this time, the DLL adjusts a phase of the inverse feedback signal /fb generated by the reverse external clock signal /clk by increasing the delay value of the delay line block 317. And then, the DLL may normally outputs a desired DLL clock signal to an external part.

However, referring to FIG. 5, if a phase difference between the external clock signal clk and a feedback signal fb_r is in a dead-zone, i.e., a phase of the feedback clock signal fb_r is very similar to that of the external clock signal clk according to various conditions including a supply voltage, a temperature and the like, the phase comparison block 313 may output an improper comparison result to the MUX controller 314 and the delay line control block 316. As above described, if the phase comparison block 313 determines that a rising edge of the feedback signal fb_r should be led to that of the external clock signal clk, it is possible because the feedback signal fb_r passes through a minimum number of delay units in the DLL. Finally, the DLL shown in FIG. 3 still has a problem, i.e., cannot guarantee a stable operation when a phase difference is in the dead-zone. Herein, this phenomenon is called "stuck fail".

SUMMARY OF INVENTION

It is, therefore, an object of the present invention to provide a delayed lock loop (DLL), included in a semiconductor memory device, and its operating method for preventing a stuck fail in a dead-zone.

Also, it is another object of the present invention to provide a delayed lock loop, included in a semiconductor memory device, and its operating method for effectively reducing a delay value of a delay line block, e.g., the number of delay units included in the delay line block of the DLL.

In accordance with an aspect of the present invention, there is provided a method for operating a delayed lock loop of a semiconductor memory device in order to prevent a stuck fail in a dead-zone, including the steps of: a) feeding back one of a first and a second internal clock signals as a feedback signal; b) delaying the feedback signal by a first predetermined delay value in order to prevent the stuck fail in the dead-zone; c) comparing a phase of a delayed feedback signal and a phase of the feedback signal with a phase of the external clock signal, respectively; and d) delaying a selected internal clock signal, which is determined based on one comparison result, by a delay value based on the other comparison result.

In accordance with another aspect of the present invention, there is provided a method for operating a delayed lock loop of a semiconductor memory device in order to prevent a stuck fail in a dead-zone, including the steps of: a) feeding back one of a first and a second internal clock signals as a feedback signal; b) delaying the feedback signal by a first predetermined delay value in order to prevent the stuck fail in the dead-zone; c) selecting one of the feedback signal and a delayed feedback signal based on a currently locking state; d) comparing a phase of a selected feedback signal with a phase of the external clock signal; and e) delaying a selected internal clock signal by a delay value, wherein the selected internal clock signal, the delay value and the currently locking state are determined based on the comparison result.

In accordance with another aspect of the present invention, there is provided a delayed lock loop for preventing a stuck fail in a dead-zone, including a clock buffering block for receiving an external clock signal and a reverse external clock signal and generating a first and a second internal clock signals; a phase comparison block for delaying a feedback signal by a first predetermined value and for respectively comparing a phase of a delayed feedback signal and a phase of the feedback signal with a phase of the external clock signal; a clock selecting block for selecting one of the first and second internal clock signals based on one comparison result of the delayed feedback signal and the external clock signal to thereby generate a selected internal clock signal; a stuck checking block for determining a delay value based on the other comparison result of the feedback signal and the external clock signal; a delay line block for delaying the selected internal clock signal by the delay value; and an output buffer for buffering an outputted signal from the delay line block to thereby generating a DLL clock signal.

In accordance with another aspect of the present invention, there is provided a delayed lock loop for preventing a stuck fail in a dead-zone, including a clock buffering block for receiving an external clock signal and a reverse external clock signal and generating a first and a second internal clock signals; a phase comparison block for delaying a feedback signal by a first predetermined value, for selecting one of the feedback signal and a delayed feedback signal based on a currently locking state and for comparing a selected feedback signal with the external clock signal; a clock selecting block for selecting one of the first and second internal clock signals based on one comparison result of the delayed feedback signal and the external clock signal to thereby generate a selected internal clock signal; a stuck checking block for determining a delay value and the currently locking state based on the other comparison result of the feedback signal and the external clock signal; a delay line block for delaying the selected internal clock signal by the delay value; and an output buffer for buffering an outputted signal from the delay line block to thereby generating a DLL clock signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device having a delayed lock loop (DLL) according to the present invention will be described in detail referring to the accompanying drawings.

Figure 1:
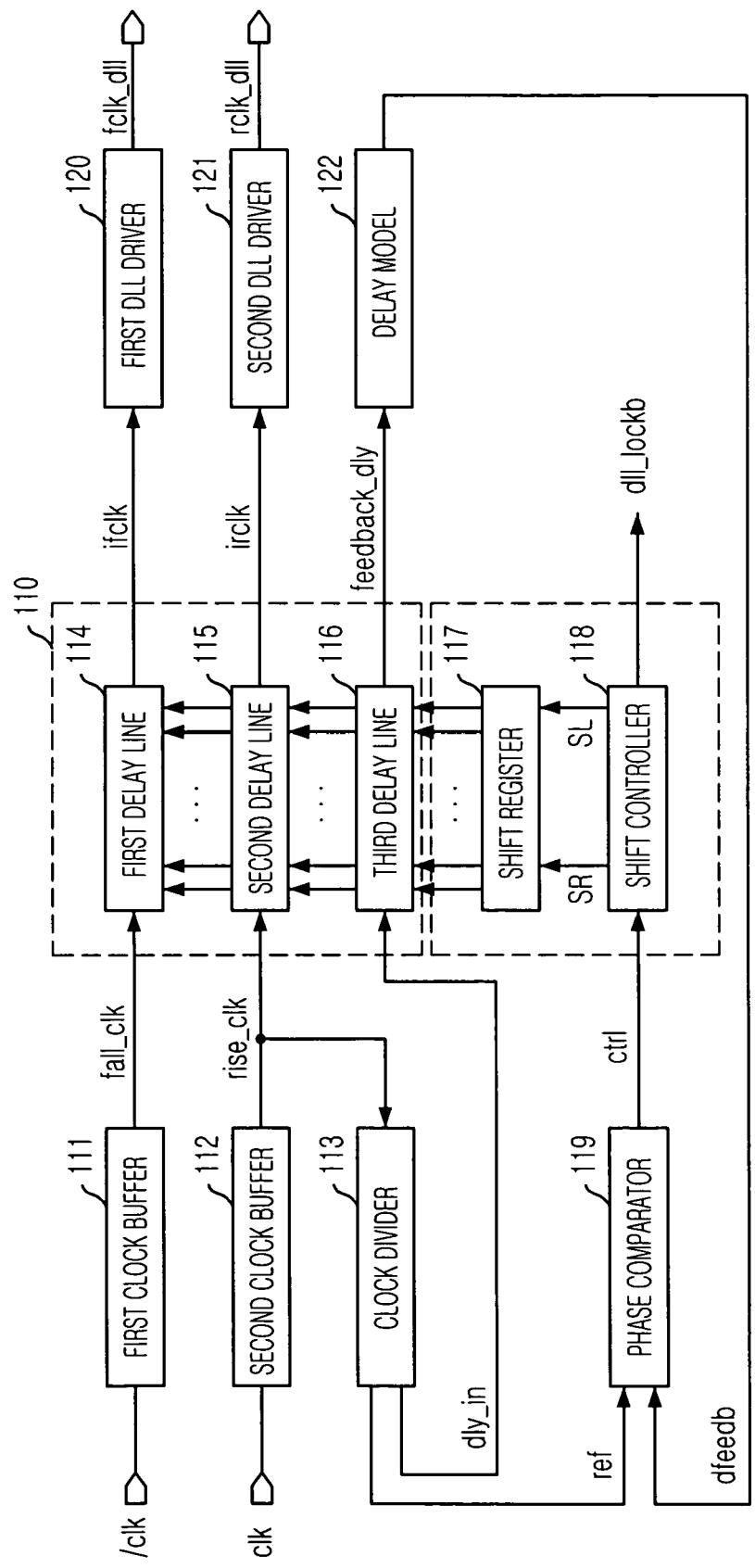
FIG. 1 is a block diagram showing a delayed locked loop (DLL) of a double data rate synchronous dynamic random access memory (DDR SDRAM) in accordance with an embodiment of the prior art.
Figure 2A:
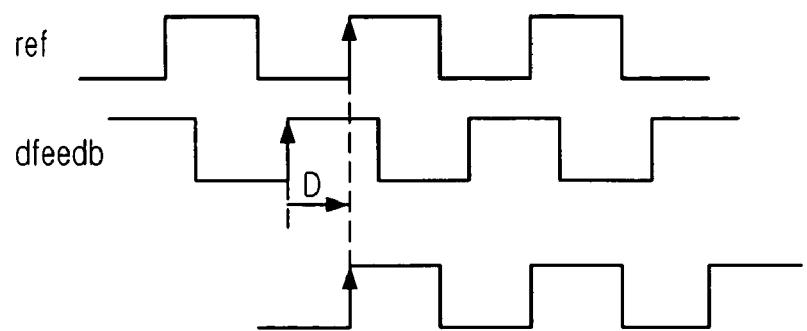
FIGS. 2A and 2B are waveforms demonstrating an operation of the DLL shown in FIG. 1.
Figure 2B:
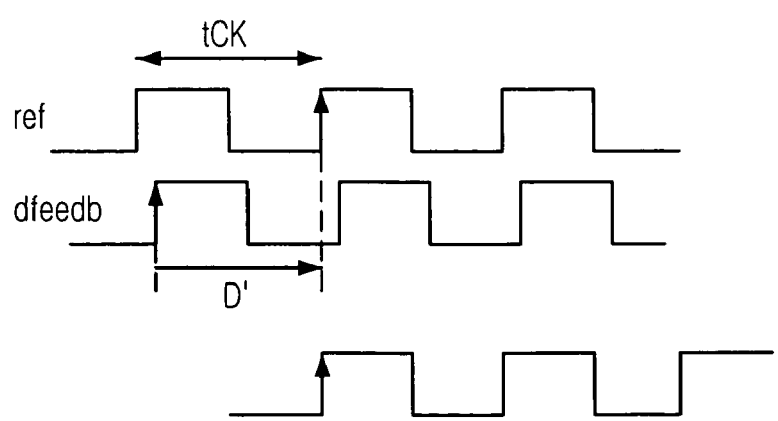
Figure 3:
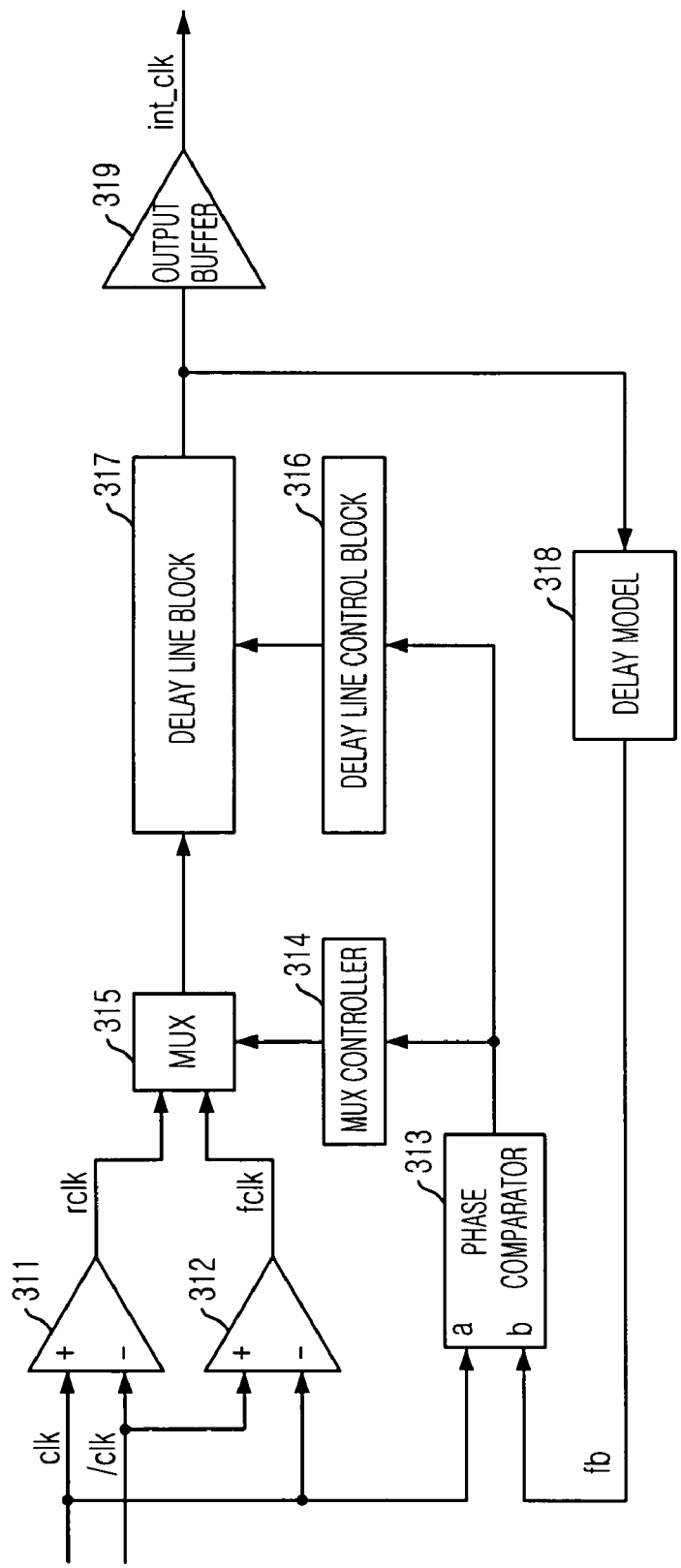
FIG. 3 is a block diagram showing a DLL in accordance with another embodiment of the prior art.
Figure 4A:
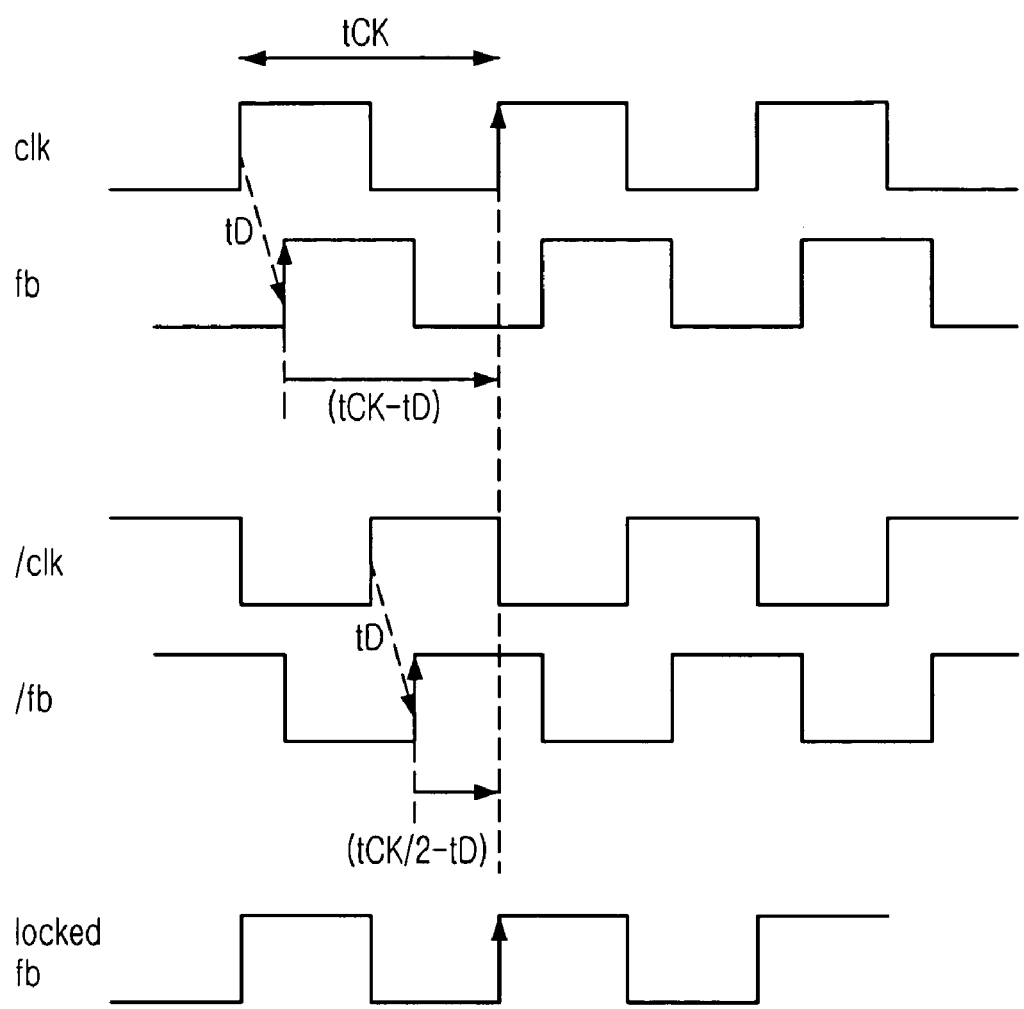
FIGS. 4A and 4B are waveforms demonstrating an operation of the DLL shown in FIG. 3.
Figure 4B:
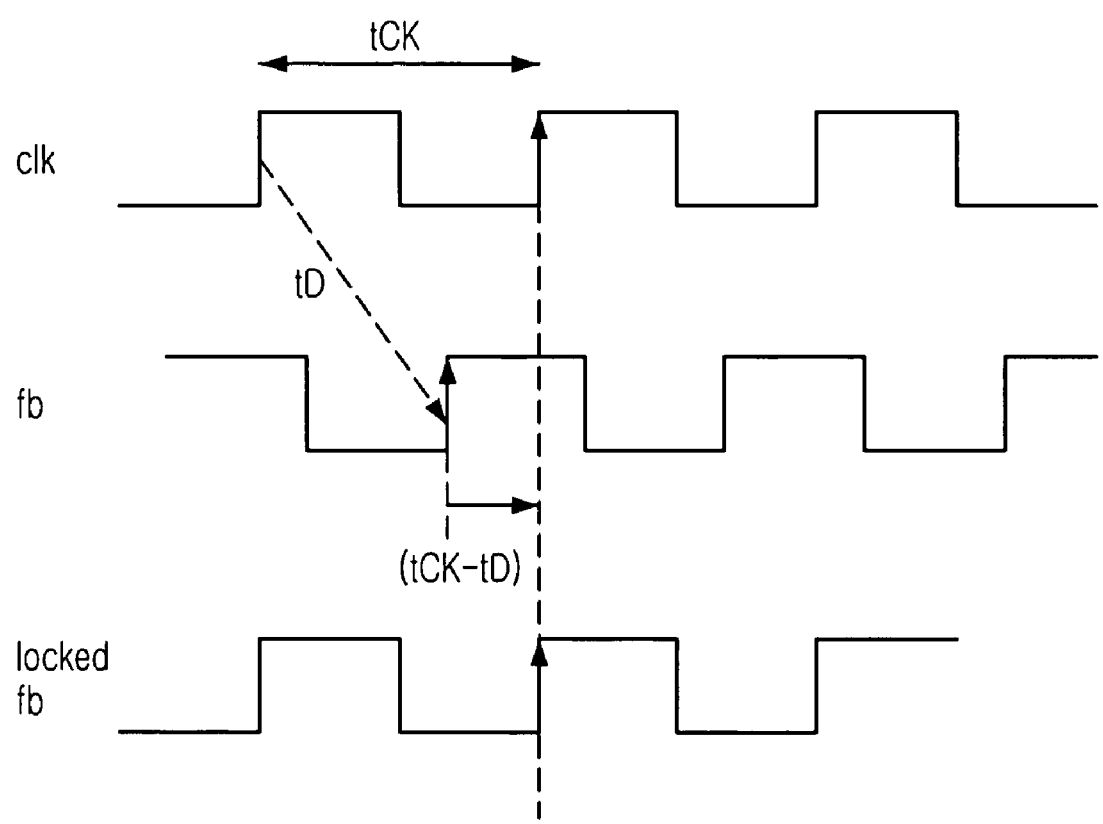
Figure 5:
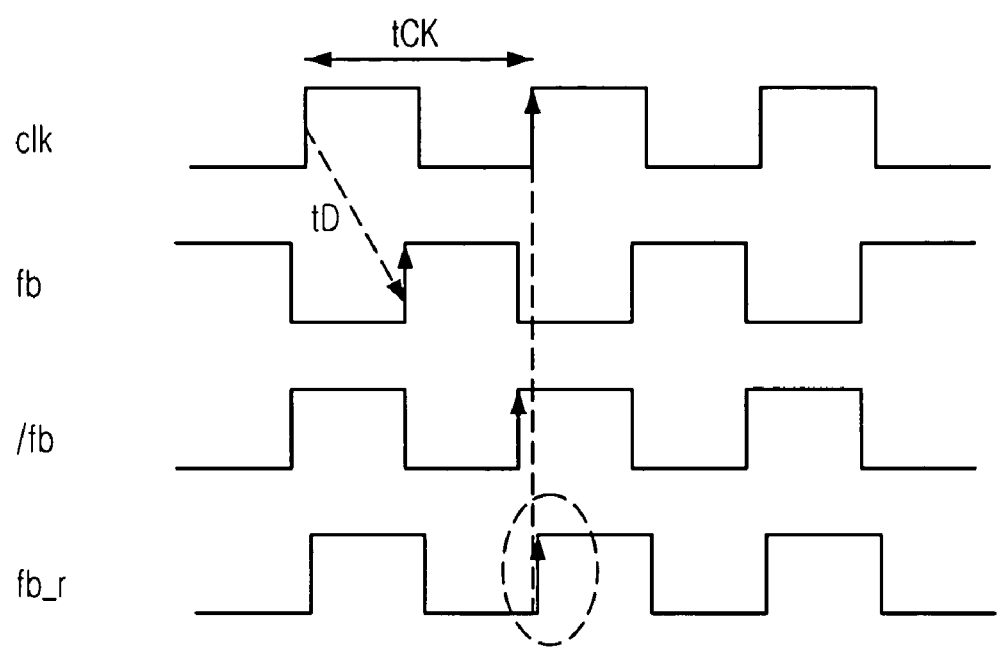
FIG. 5 is waveforms describing an operation error of the DLL shown in FIG. 3.
Figure 6:
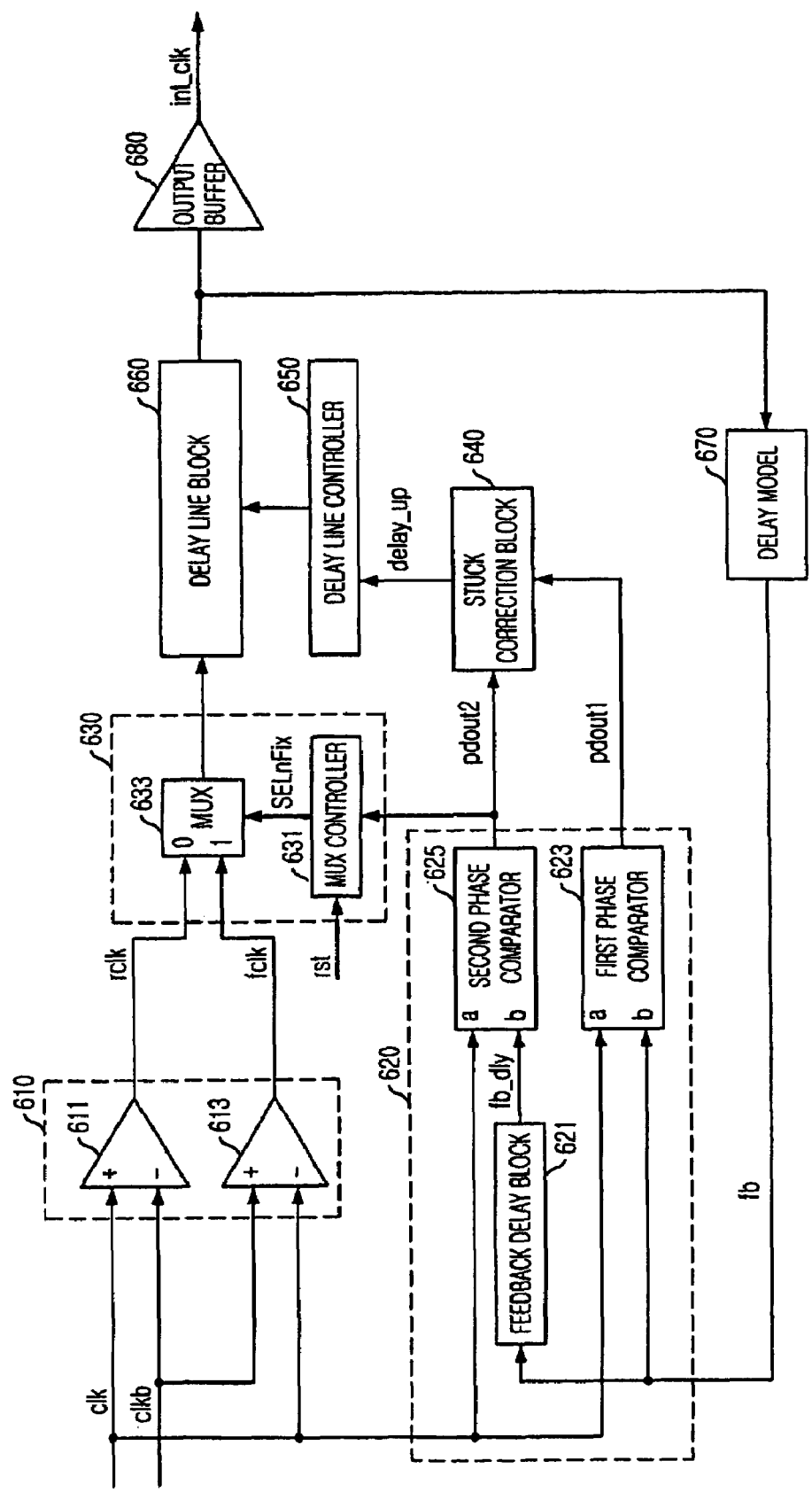
FIG. 6 is a block diagram depicting a DLL in accordance with a first embodiment of the present invention.

FIG. 6 is a block diagram depicting a DLL in accordance with a first embodiment of the present invention.

As shown, the DLL includes a buffering block 610, a selecting block 630, a phase comparing block 620, a delay line block 660, a delay line control block 650, a stuck checking block 640, a delay modeling block 670 and an output buffer 680.

The clock buffering block 610 receives an external clock signal clk and a reverse external clock signal clkb to thereby generate a first and a second internal clock signals rclk and fclk. In detail, the clock buffering block 610 has a first clock buffer 611 and a second clock buffer 613. The first clock buffer 611 receives the external clock signal clk and the reverse external clock signal clkb and generating the first internal clock signal rclk which is corresponded to the external clock signal clk. Namely, the external clock signal clk is inputted through a non-inverting terminal; and the inverse external clock signal clkb is inputted through an inverting terminal. Thus, the inverse external clock signal clkb is inverted and, then, the first internal clock rclk outputted from the first clock buffer 611 becomes stable. Likewise, the second clock buffer 613 receives the external clock signal clk and the reverse external clock signal clkb;

and, then, generates the second internal clock signal fclk which is corresponded to the inverse external clock signal clkb.

The phase comparison block 620 has a first delay block 621 and first and second phase comparators 623 and 625. The first delay block 621 delays a feedback signal fb by a first predetermined value. As shown, the first delay block 621 has K number of delay units, i.e., the first predetermined value ($\alpha$)=K×delay value of delay units (tUD). Herein, K is a positive integer. The second phase comparator 625 compares a phase of the external clock signal clk with a phase of a delayed feedback signal fb_dly outputted from the first delay block 621 to thereby output a second control signal pdout2 to the clock selecting block 630 and the stuck checking block 640. Herein, the second control signal pdout2 is a logical low state if a falling edge of the external clock signal leads against a rising edge of the delayed feedback clock signal; and, otherwise, is a logical high state.

Likewise, the first phase comparator 623 compares the phase of the external clock signal clk with a phase of the feedback signal fb outputted from the delay modeling block 670. Then, the first phase comparator 623 outputs a first control signal pdout1 to the stuck checking block 640. Herein, the first control signal pdout1 is a logical low state if the falling edge of the external clock signal leads against a rising edge of the feedback clock signal; and, otherwise, is a logical high state.

The second control signal pdout2 is inputted to the clock selecting block 630 for selecting one of the first and second internal clock signals rclk and fclk. The clock selecting block 630 has a MUX controller 631 and a first multiplexer 633. The MUX controller 631, which is reset by a reset signal rst, generates a selection control signal SELnFix according to the second control signal pdout2. The first multiplexer 633 selectively outputs one of the first and second internal clock signals rclk and fclk to the delay line block 660. Herein, if the second control signal pdout2 is a logical low state, the selection control signal SELnFix can be a logical low state; and, then, the first multiplexer 633 outputs the first internal clock signal rclk to the delay line block 660. Otherwise, the selection control signal SELnFix can be a logical high state; and, then, the first multiplexer 633 outputs the second internal clock signal fclk to the delay line block 660. Herein, the selection control signal SELnFIX is later described in detail, referring to FIG. 14.

In the other hand, the stuck checking block 640 receives the first and second control signals pdout1 and pdout2 for determining a delay value. Also, the delay line block 660 is for delaying a selected internal clock signal outputted from the clock selecting block 630 by the delay value to thereby generate a delayed internal clock signal. The output buffer 680 buffers the delayed internal clock signal to thereby generate a DLL clock signal int_clk.

Herein, the delayed internal clock signal outputted from the delay line block 660 is also inputted to the delay modeling block 670. The delay modeling block 670, which is a kind of replica circuit, delays the delayed internal clock outputted from the delay line block 660 by a second predetermined delay value, wherein the second predetermined delay value reflects a delay amount of actual data and clock paths. Then, the delayed internal clock is fed back as the feedback signal fb which is inputted to the phase comparing block 620 throughout the delay modeling block 670.

Moreover, the delay line block 660 having a plurality of shift units is controlled by a shifting direction signal generated by the delay line control block 650. The delay line control block 650 receives a delay control signal delay_up outputted from the stuck checking block 640 and outputs the shifting direction signal based on the delay value. Namely, according to the shifting direction signal, it is determined how many the shift units are used for delaying the selected internal clock signal by the delay value.

Figure 7:
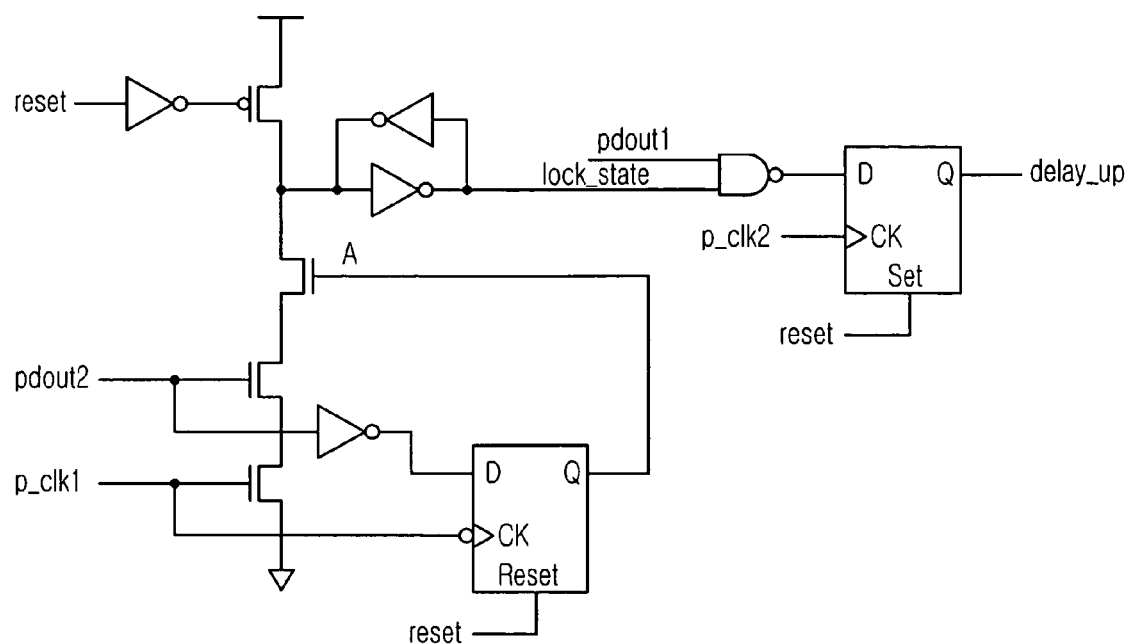
FIG. 7 is a schematic circuit diagram describing a stuck checking block shown in FIG. 6.

FIG. 7 is a schematic circuit diagram describing the stuck checking block 640 shown in FIG. 6.

As shown, the stuck checking block 640, which outputs the delay control signal delay_up, always increases the delay value of the delay line block 660 if a currently locking state signal lock_state is a logical low state; and, otherwise, increases or decreases the delay value of the delay line block 660 according to the first control signal pdout1 outputted from the first phase comparator 623. Herein, the currently locking state signal lock_state is a logical low state before a rising edge of the external clock signal clk is closed to a rising edge of the feedback signal fb under a predetermined level, i.e., a phase difference between the external clock signal clk and the feedback signal fb is over the predetermined level. And then, if the currently locking state signal lock_state is a logical low state, the delay control signal delay_up is a logical high state.

Otherwise, when a phase difference between the external clock signal clk and the feedback signal fb is under the predetermined level, the currently locking state signal lock_state is a logical high state. In this case, i.e., the currently locking state signal lock_state is a logical high state, the delay control signal delay_up is a logical high state if the first control signal pdout1 is a logical low state; and the delay control signal delay_up is a logical low state if the first control signal pdout1 is a logical high state. Herein, the delay value is increased if the delay control signal delay_up is a logical low state, but the delay value is decreased if the delay control signal delay_up is a logical high state.

Namely, if the phase difference between the external clock singal clk and the feedback signal fb is too large, the currently locking state signal lock_state is low and, then, the delay value is increased. Likewise, if not, the delay value is decreased.

Referring to FIG. 7, the currently locking state signal lock_state is determined by the second control signal pdout2 outputted from the second phase comparator 625. Hereinafter, referring to FIGS. 7 to 8C, the current locking state signal lock_state is described in detail.

Figure 8A:
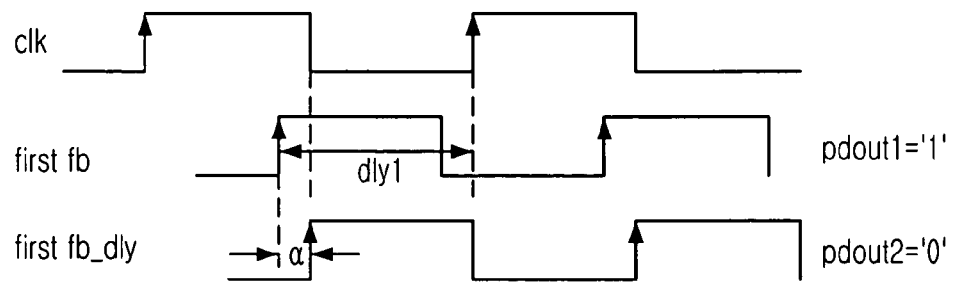
FIGS. 8A to 8C are waveforms describing three cases based on results of the phase comparing block receiving a feedback signal and a delayed feedback signal in an operation of the DLL shown in FIG. 6.
Figure 8B:
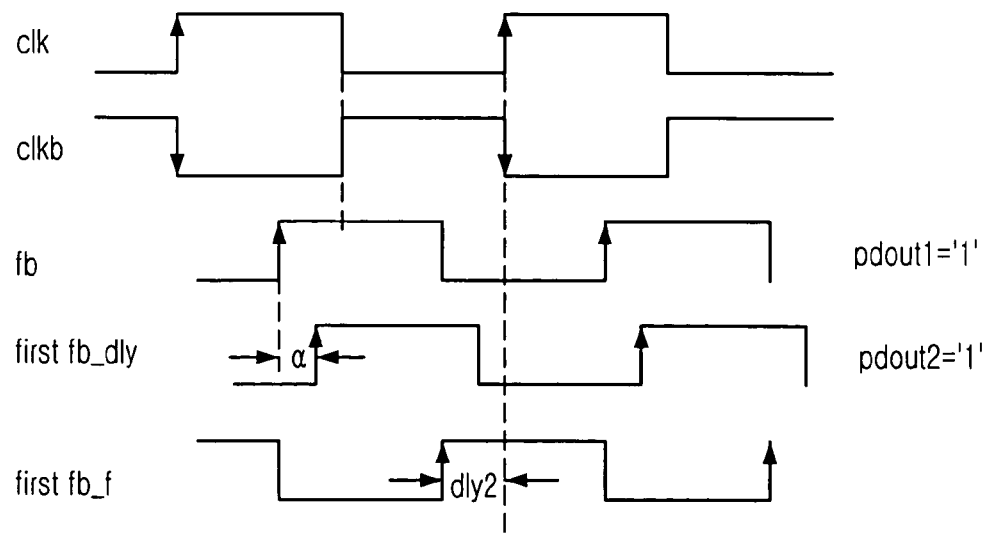
Figure 8C:
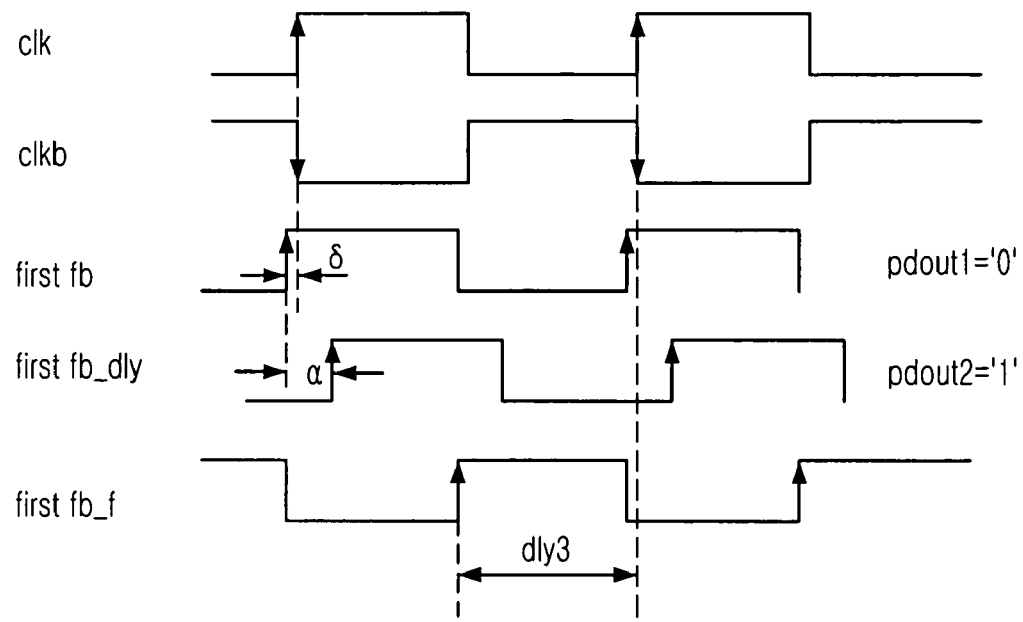

FIGS. 8A to 8C are waveforms describing three cases based on results of the phase comparing block receiving a feedback signal and a delayed feedback signal in an operation of the DLL shown in FIG. 6;

Referring to FIG. 8A, there is described a first case that a rising edge of the feedback signal fb lags against a rising edge of the external clock signal clk; and a rising edge of the delayed feedback signal fb_dly does not lead against a falling edge of the external clocks signal clk. As a result, the first control signal pdout1 is a logical high state; and the second control signal pdout2 is a logical low state. Herein, for synchronizing the feedback signal fb with the external clock signal clk, the feedback signal fb is delayed by a first delay amount dly1 for moving the rising edge of the feedback signal fb to a next rising edge of the external clock signal clk. At this time, the currently locking state signal lock_state is a logical low state; and the delay value is increased.

Next, referring to FIG. 8B, there is described a second case that a rising edge of the feedback signal fb lags against a rising edge of the external clock signal clk; and a rising edge of the delayed feedback signal fb_dly leads against a falling edge of the external clocks signal clk. As a result, the first and second control signals pdout1 and pdout2 are a logical high state. Herein, for synchronizing the feedback signal fb with the external clock signal clk, the reverse feedback signal fb is delayed by a second delay amount dly2 for moving the rising edge of the reverse feedback signal fb_f to a next rising edge of the external clock signal clk. At this time, the currently locking state signal lock_state is still a logical low state; and the delay value is increased. In this case, the delay line block 660 receives the second internal clock signal fclk from the clock selecting block 630 because the second control signal pdout2 is a logical high state. As a result, total delay amount by which the delay line block 660 delays the second internal clock signal rclk is under a half period of the external clock signal clk.

Lastly, referring to FIG. 8C, there is described a second case that a rising edge of the feedback signal fb leads against a rising edge of the external clock signal clk; and a rising edge of the delayed feedback signal fb_dly lags against the rising edge of the external clocks signal clk. As a result, the first control signal pdout1 is a logical low state; and second control signal pdout2 is a logical high state. Herein, for synchronizing the feedback signal fb with the external clock signal clk, the reverse feedback signal fb is delayed by a third delay amount dly3 for moving the rising edge of the reverse feedback signal fb_f to a next rising edge of the external clock signal clk. At this time, the currently locking state signal lock_state is a logical high state; and the delay value is still increased because the first control signal pdout1 is a logical low state. However, if the first control signal pdout1 becomes a logical high state later when the rising edge of the feedback signal fb lags against the rising edge of the external clock signal clk, the delay value is decreased. In this case, the delay line block 660 also receives the second internal clock signal fclk from the clock selecting block 630 because the second control signal pdout2 is a logical high state. Thus, total delay amount by which the delay line block 660 delays the second internal clock signal rclk can be over a half period of the external clock signal clk. Namely, in the present invention, the maximum delay value of the delay line block 660 is tCK÷2+α.

Referring to FIG. 7, there are first and second toggling signals pclk1 and pclk2 respectively inputted to a clock terminal of each D flip-flop included in the stuck checking block 640. The first toggling signal pclk1 controls a timing of changing a logical state of the currently locking state signal lock_state; and the second toggling signal pclk2 controls a timing of changing a logical state of the delay control signal delay_up.

Figure 9A:
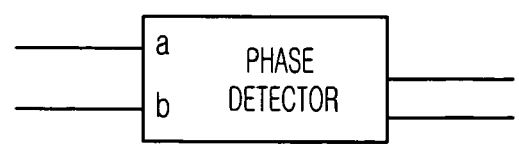
FIG. 9A is a block diagram showing a kind of phase comparator for using as a first or a second phase comparing block included in the DLL shown in FIG. 6.
Figure 9B:
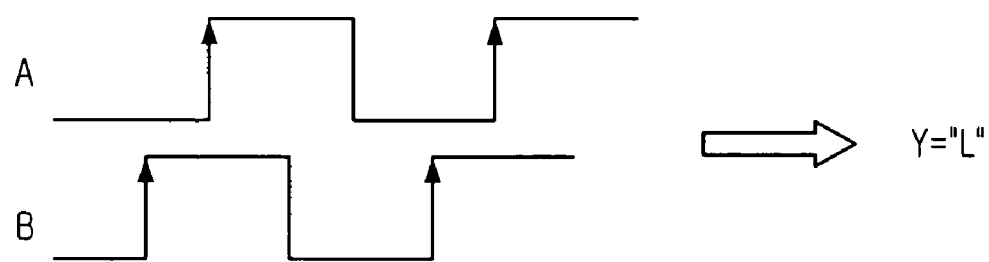
FIGS. 9B and 9C are waveforms demonstrating an operation of the phase comparator shown in FIG. 9A.
Figure 9C:
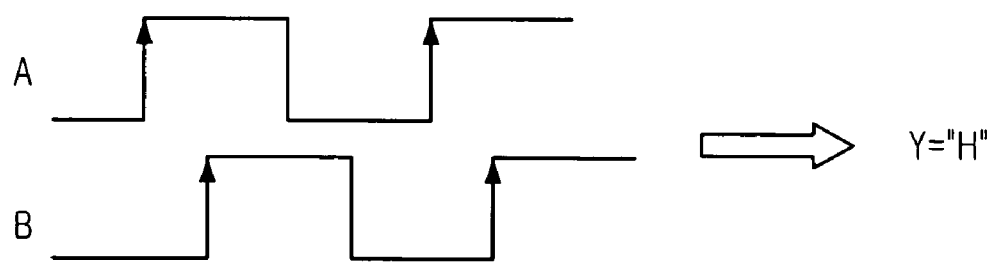

FIG. 9A is a block diagram showing a kind of phase comparator for using as a first or a second phase comparators 623 and 625 included in the DLL shown in FIG. 6. Also, FIGS. 9B and 9C are waveforms demonstrating an operation of the phase comparator shown in FIG. 9A.

As shown in FIG. 9A, the phase comparator receives two A and B signals throughout two terminals 'a' and 'b' and generates a result signal Y throughout a terminal 'y'. In FIG. 9B, the phase comparator outputs the result signal Y having a logical low state if a rising edge of the A signal, which is inputted throughout the 'a' terminal, lags a rising edge of the B signal, which is inputted throughout the 'b' terminal. Contrary to FIG. 9B, in FIG. 9C, the phase comparator outputs the result signal Y having a logical high state if a rising edge of the A signal, which is inputted throughout the 'a' terminal, leads a rising edge of the B signal, which is inputted throughout the 'b' terminal.

Figure 10A:
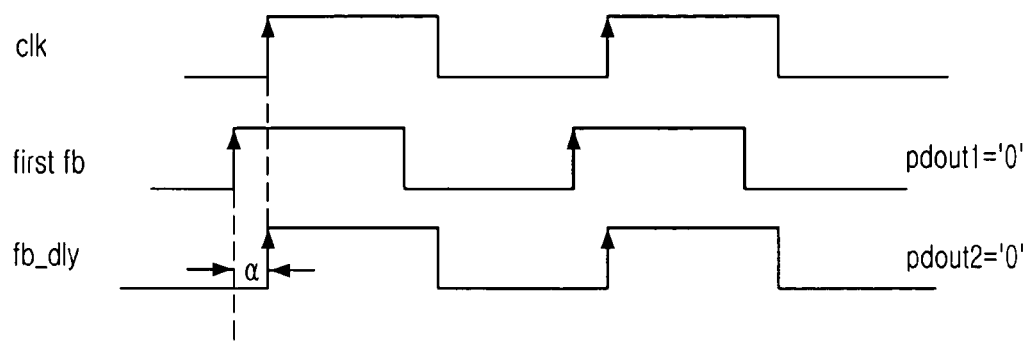
FIG. 10A is a waveform describing another case based on another result of the phase comparing block receiving a feedback signal and a delayed feedback signal in an operation of the DLL shown in FIG. 6.
Figure 10B:
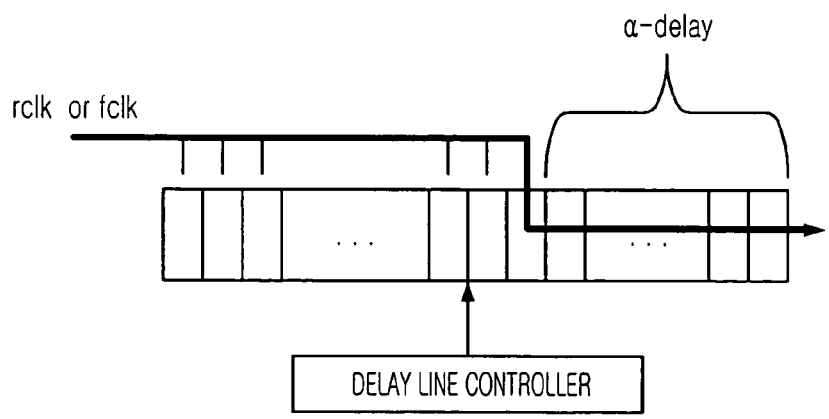
FIG. 10B is a block diagram depicting an operation of a delay line block, which is included in the DLL shown in FIG. 6, in an initial operation state described in FIG. 10A.

FIG. 10A is a waveform describing another case based on another result of the phase comparing block receiving a feedback signal and a delayed feedback signal in an operation of the DLL shown in FIG. 6. FIG. 10B is a block diagram depicting an operation of a delay line block, which is included in the DLL shown in FIG. 6, in an initial operation state described in FIG. 10A.

This case shown in FIG. 10A is occurred in an initial operation state of the DLL. Herein, each rising edge of the feedback signal fb and the delayed feedback signal fb_dly leads against a rising edge of the external clock signal clk. At this time, the first and second phase comparators 623 and 625 generate the first and second control signals having a logical low state respectively. Referring to FIGS. 10A and 10B, if the rising edge of the delayed feedback signal fb_dly is synchronized with the rising edge of the external clock signal clk, the delay line block 660 receives the first internal clock signal rclk and, then, delays the first internal clock signal rclk by the first predetermined value α.

Figure 11:
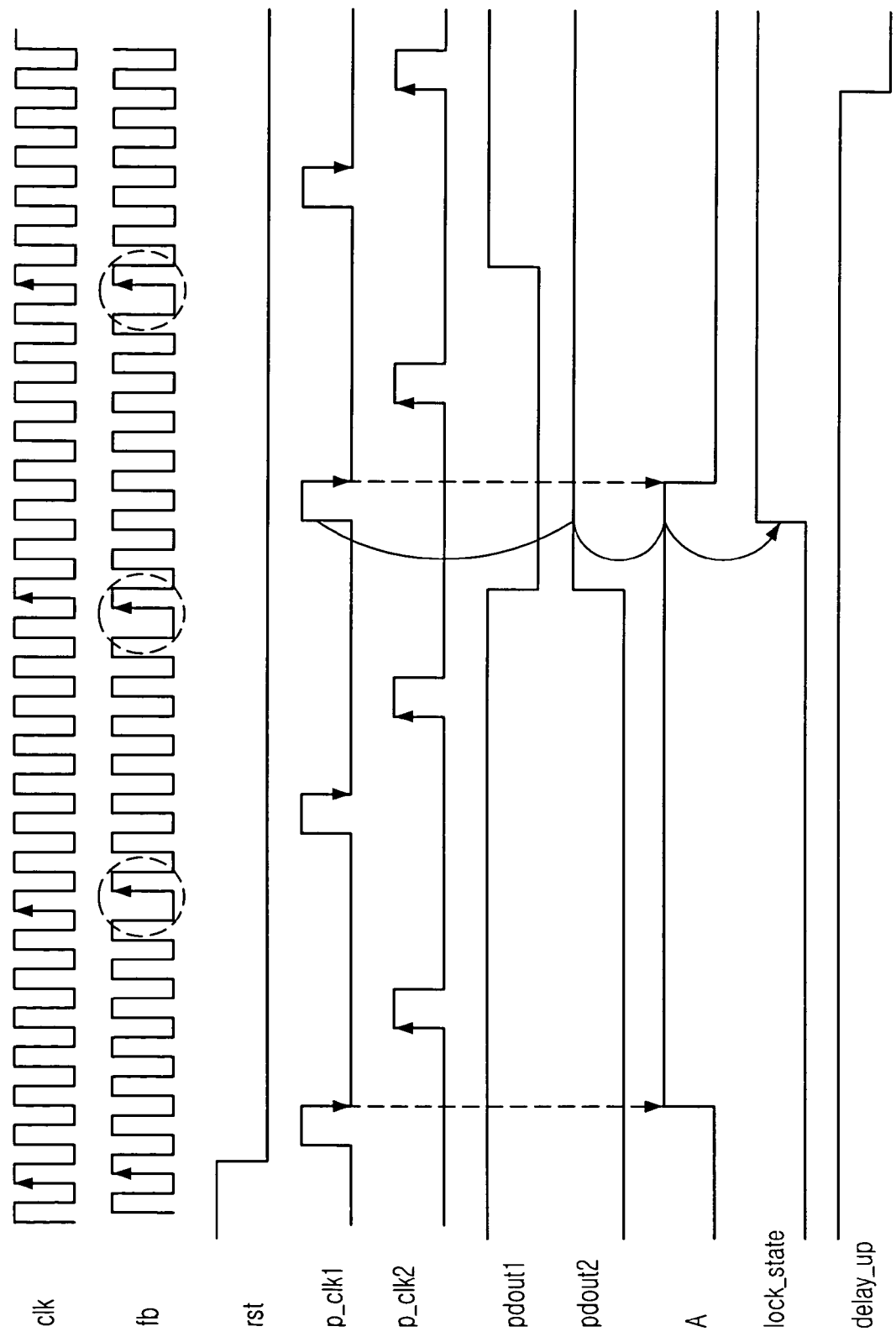
FIG. 11 is a waveform demonstrating an operation of the DLL shown in FIG. 6.

FIG. 11 is a waveform demonstrating the operation of the DLL shown in FIG. 6.

As shown, it is described how the currently locking state signal lock_state is changed from a logical low state to a logical high state. Herein, the detailed description about FIG. 11 is omitted because detailed steps of the DLL operation are already depicted referring to FIGS. 6 to 11. The feedback signal fb is delayed by a predetermined delay value at every period of the first toggling signal p_clk1.

Figure 12:
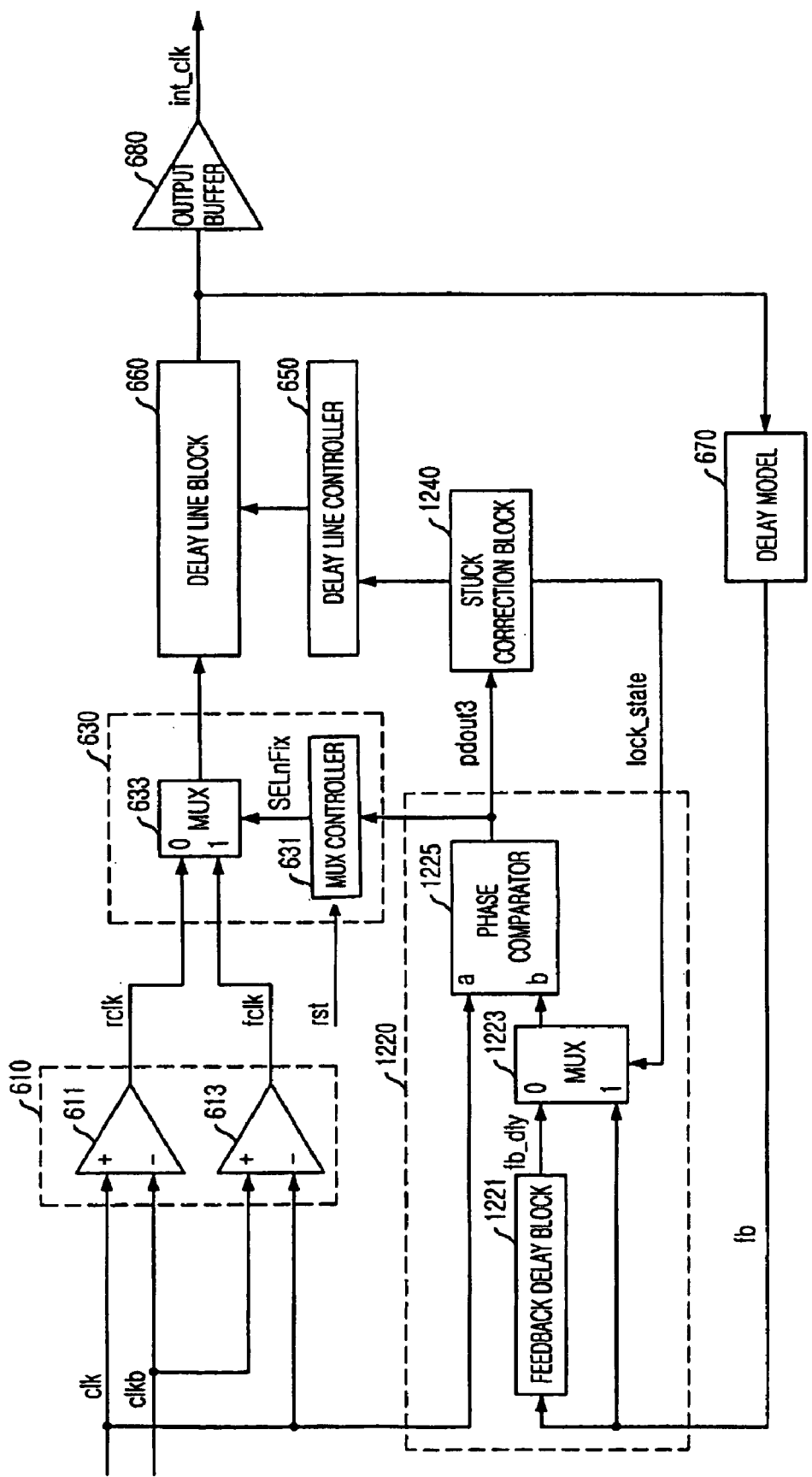
FIG. 12 is a block diagram depicting a DLL in accordance with a second embodiment of the present invention.

FIG. 12 is a block diagram depicting a DLL in accordance with a second embodiment of the present invention.

As shown, the DLL is very similar to the DLL described in FIG. 6. Herein, differences between the DLLs in accordance with the first and second embodiments of the present invention are described.

Contrary to the phase comparing block 620, there is a selection and comparison block 1220. The selection and comparison block 1220 includes a second delay block 1221, a second multiplexer 1223 and a third phase comparator 1225.

In detail, the second delay block 1221 is same to the first delay block 621 shown in FIG. 6; and the third phase comparator 1225 is a kind of phase comparator shown in FIG. 9A. However, in the DLL in accordance with the second embodiment of the present invention, first of all, one of a delayed feedback signal fb_dly and a feedback signal fb is selected by the second multiplexer 1223 based on a currently clocking state signal lock_state outputted from a second stuck checking block 1240; and, then, a selected feedback signal is compared with the external clock signal clk. Namely, if the currently clocking state signal lock_state is a logical low, state, the delayed feedback signal fb_dly is compared with the external clock signal clk by the third phase comparator 1225; and, otherwise, the feedback signal fb is compared with the external clock signal clk by the third phase comparator 1225.

Figure 13:
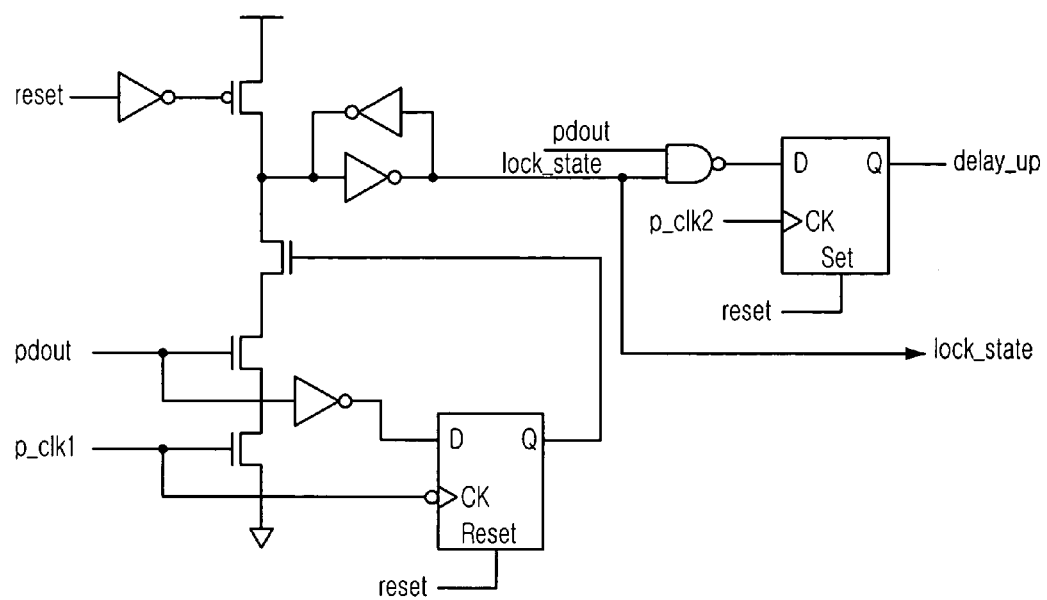
FIG. 13 is a schematic circuit diagram describing a second stuck checking block shown in FIG. 12.

FIG. 13 is a schematic circuit diagram describing the second stuck checking block 1240 shown in FIG. 12.

As shown, the second stuck checking block 1240 is same to the stuck checking block 640 described in FIG. 7 except that the currently locking state signal lock_state is inputted to the second multiplexer 1223. So, the detailed description about the second stuck checking block 1240 is omitted herein.

Figure 14:
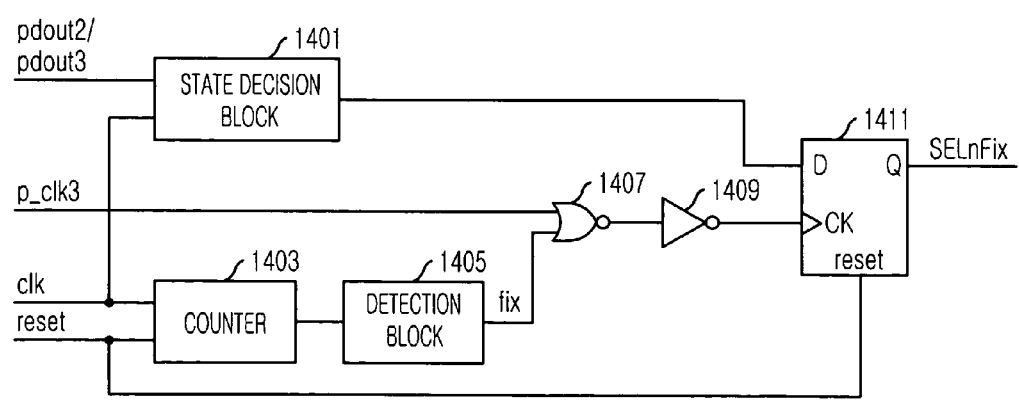
FIG. 14 is a block diagram showing a MUX controller shown in FIGS. 6 and 12.

FIG. 14 is a block diagram showing the MUX controller 631 shown in FIGS. 6 and 12.

As shown, the MUX controller 631 includes a state decision block 1401, a counter 1403, a detection block 1405, a first NOR gate 1407, a first inverter 1409 and a first D flip-flop 1411.

The state decision block 1401 receives the external clock signal clk and the second control signal pdout2 outputted from the phase comparator 625/1255 shown in FIGS. 6 and 12. Then, the state decision block 1401 periodically checks a logical state of the second or third control signal pdout2 or pdout3 to thereby determine which state of the second control signal pdout2 is more than the other.

The counter 1403 reset by the reset signal rst receives the external clock signal clk and counts rising/falling edges of the external clock signal clk in order to deliver a counted result into the detection block 1405. Then, if the counted result satisfies a predetermined condition, the diction block 1405 determine a timing of outputting an output of the state decision block 1401 as the selection control signal SELnFix to the first multiplexer 633 by outputting a timing control signal fix having a logical high state to the first NOR gate 1407. The first NOR gate 1407 receives the timing control signal fix and a third toggling signal p_clk3 and outputs a result of logic NOR operation to the first D flip-flop 1411 through the first inverter 1409. Thus, for example, if the timing control signal fix is a logical high state, the second control signal pdout2 cannot be outputted as the selection control signal SELnFix; and, otherwise, the second control signal pdout2 is outputted as the selection control signal SELnFix to the first multiplexer 633.

As above described, the DLL in accordance with the present invention can effectively decrease the delay value of a delay line block 660. Herein, the maximum of the delay value is tCK÷2+α. Thus, the number of delay units included in the delay line block 660 of the DLL can be also reduced; and, then, a power consumption of the delay line block 660, i.e., the DLL, can be also reduced.

In addition, the DLL in accordance with the present invention can prevent a stuck fail in a dead-zone by comparing the delay feedback signal with the external clock signal. Furthermore, this stable operation of the DLL can have a good performance under a changeable circumstance according to a power, a temperature and the like.

The present application contains subject matter related to Korean patent applications No. 2004-14909, filed in the Korean Patent Office on Mar. 5, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A delayed lock loop for preventing a stuck fail in a dead-zone, comprising:
   a clock buffering block for receiving an external clock signal and a reverse external clock signal and generating a first and a second internal clock signals;
   a phase comparison block including a first phase comparator and a feedback delay block coupled to a second phase comparator, the first phase comparator and the second phase comparator concurrently comparing a phase of a delayed feedback signal with a phase of the external clock signal and a phase of a feedback signal with a phase of the external clock signal, respectively, the feedback delay block delaying the feedback signal by a first predetermined value to produce the delayed feedback signal;
   a clock selecting block for selecting one of the first and second internal clock signals based on a first comparison result of the delayed feedback signal and the external clock signal to thereby generate a selected internal clock signal;
   a stuck checking block for determining a delay value based on a second comparison result of the feedback signal and the external clock signal and the first comparison result of the delayed feedback signal and the external clock signal;
   a delay line block for delaying the selected internal clock signal by the delay value; and
   an output buffer for buffering an outputted signal from the delay line block to thereby generating a DLL clock signal.

2. The delayed lock loop as recited in claim 1, further comprising a delay model, which is a kind of replica circuit, for delaying the outputted signal from the delay line block by a second predetermined delay value, wherein the second predetermined delay value reflects a delay amount of actual data and clock paths.

3. The delayed lock loop as recited in claim 1, wherein the clock buffering block includes:
   a first clock buffer for receiving the external clock signal and the reverse external clock signal and generating the first internal clock signal which is corresponded to the external clock signal; and
   a second clock buffer for receiving the external clock signal and the reverse external clock signal and generating the second internal clock signal which is corresponded to the inverse external clock signal.

4. The delayed lock loop as recited in claim 1, wherein the first phase comparator outputs a logical low signal to the clock selecting block if a falling edge of the external clock signal leads against a rising edge of the delayed feedback clock signal; and, otherwise, outputs a logical high signal to the clock selecting block.

5. The delayed lock loop as recited in claim 4, wherein the clock selecting block includes:
   a MUX controller, which is reset by a reset signal, for generating a select control signal based on a logical state of an outputted signal from the first phase comparator; and
   a multiplexer for outputting the first internal clock signal to the delay line block if the select control signal is a logical low state; and, otherwise, outputting the second internal clock signal to the delay line block.

6. The delayed lock loop as recited in claim 1, wherein the second phase comparator outputs a logical low signal to the stuck checking block if a falling edge of the external clock signal leads against a rising edge of the feedback clock signal; and, otherwise, outputs a logical high signal to the clock selecting block.

7. The delayed lock loop as recited in claim 1, wherein the stuck check block receives output signals from the first and second phase comparators and outputs a delay control signal to the delay line block for adjusting the delay value of the delay line block.

8. The delayed lock loop as recited in claim 7, wherein the delay line block includes:
   a delay line controller for receiving a delay control signal and outputting a shifting direction signal based on the delay value; and
   a delay line unit having a plurality of shift units for delaying the selected internal clock signal according to the shifting direction signal.

9. The delayed lock loop as recited in claim 1, wherein the phase comparison block delays the feedback signal by a value greater than a length of the dead zone in order to prevent the stuck fail in the dead-zone.

10. The delayed lock loop as recited in claim 4, wherein the stuck checking block determines the delay value based on an output of the second phase comparator when an output of the first phase comparator changes from the logical low signal to the logical high signal, and otherwise, increases the delay value.

* * * * *